(12) United States Patent
Katcha et al.

(10) Patent No.: US 12,360,167 B2
(45) Date of Patent: Jul. 15, 2025

(54) ENERGY STORAGE SYSTEM AND METHOD OF CONTROL

(71) Applicant: Present Power Systems, LLC, Cedarburg, WI (US)

(72) Inventors: Jason Stuart Katcha, Cedarburg, WI (US); Nathan Timothy Larsen, Milwaukee, WI (US)

(73) Assignee: Unico, LLC, Franksville, WI (US)

( * ) Notice: Subject to any disclaimer, the term of this patent is extended or adjusted under 35 U.S.C. 154(b) by 256 days.

(21) Appl. No.: 18/196,352

(22) Filed: May 11, 2023

(65) Prior Publication Data

US 2023/0369982 A1 Nov. 16, 2023

Related U.S. Application Data

(60) Provisional application No. 63/473,260, filed on May 11, 2022.

(51) Int. Cl.
| | |
|---|---|
| *G01R 31/382* | (2019.01) |
| *H02J 1/10* | (2006.01) |
| *H02J 3/32* | (2006.01) |
| *H02J 3/38* | (2006.01) |
| *H02J 7/35* | (2006.01) |
| *H02M 1/00* | (2007.01) |

(52) U.S. Cl.
CPC .......... *G01R 31/382* (2019.01); *H02J 1/102* (2013.01); *H02J 3/32* (2013.01); *H02J 3/381* (2013.01); *H02J 7/35* (2013.01); *H02M 1/007* (2021.05); *H02J 2300/22* (2020.01)

(58) Field of Classification Search
CPC ...... G01R 31/382; H02M 1/00; H02M 1/007; H02J 1/102; H02J 3/32; H02J 3/38; H02J 3/381; H02J 7/35; H02J 2300/22; H02J 1/10

See application file for complete search history.

(56) References Cited

U.S. PATENT DOCUMENTS

| | | |
|---|---|---|
| 7,465,872 B1 | 12/2008 | De Rooij |
| 8,023,295 B1 | 9/2011 | Shekhawat |
| 9,148,016 B2 | 9/2015 | Kaufman |
| 9,665,672 B2 | 5/2017 | Dufour |
| 10,074,981 B2 | 9/2018 | Faley |
| 2009/0302686 A1 | 12/2009 | Fishman |
| 2013/0027979 A1 | 1/2013 | Phadke |
| 2013/0057200 A1 | 3/2013 | Potts |
| 2014/0062198 A1 | 3/2014 | Luo |
| 2014/0078791 A1 | 3/2014 | Gurudasani |

(Continued)

FOREIGN PATENT DOCUMENTS

| | | |
|---|---|---|
| EP | 1531542 | 5/2005 |
| EP | 2256894 | 12/2010 |

(Continued)

*Primary Examiner* — Robert L Deberadinis
(74) *Attorney, Agent, or Firm* — Fitch, Even, Tabin & Flannery LLP

(57) ABSTRACT

DC power is converted to AC power and provided to AC loads and/or AC electrical utility grids. The amount of current and/or voltage provided by DC-DC converters to a DC bus is controlled to maintain a desired power level at an output of an AC-DC inverter that is coupled to the DC bus. These operations are automatically performed during system operation and automatically react or adapt to the addition or removal of AC loads and/or connection to the AC utility grid.

14 Claims, 3 Drawing Sheets

(56) References Cited

U.S. PATENT DOCUMENTS

| | | |
|---|---|---|
| 2014/0241016 A1 | 8/2014 | Ho |
| 2014/0375131 A1 | 12/2014 | Spanoche |
| 2015/0078049 A1 | 3/2015 | Yoo |
| 2015/0288188 A1 | 10/2015 | Keshner |
| 2016/0344188 A1 | 11/2016 | Carlson |
| 2017/0047742 A1 | 2/2017 | Narla |
| 2017/0133879 A1 | 5/2017 | Eckhardt |
| 2018/0054064 A1 | 2/2018 | Narla |
| 2019/0390619 A1 | 12/2019 | Janik |
| 2020/0279707 A1 | 9/2020 | Grossberg |
| 2021/0211066 A1 | 7/2021 | Vavilpalli |
| 2022/0006299 A1 | 1/2022 | Zhang |
| 2022/0302713 A1 | 9/2022 | Wang |
| 2023/0187930 A1 | 6/2023 | Reimann |

FOREIGN PATENT DOCUMENTS

| | | |
|---|---|---|
| EP | 2701264 | 2/2014 |
| WO | 2013127230 | 9/2013 |
| WO | 2014203561 | 12/2014 |

ENERGY STORAGE SYSTEM AND METHOD OF CONTROL

CROSS-REFERENCE TO RELATED APPLICATIONS

This application claims benefit of U.S. Provisional Application No. 63/473,260 filed May 11, 2022, which is hereby incorporated herein by reference in its entirety.

FIELD

The field of the invention generally relates to energy storage systems, and more specifically, the controlling of elements within these systems.

BACKGROUND

Energy storage systems obtain, store, and sometimes distribute energy. One example of an energy storage system includes one or more batteries. The batteries may be connected via an electrical bus to other electronic or electrical circuit elements or devices, and from these devices to a utility grid and/or electrical loads. In addition to batteries, there may be other energy sources such as solar or wind devices connected to the bus.

Various types of energy conversions may occur within these systems. For example, the energy from the batteries and other sources may be converted from direct current (DC) power to alternating current (AC) power. The AC power may then be supplied to the utility grid and/or AC loads.

Figure 1:
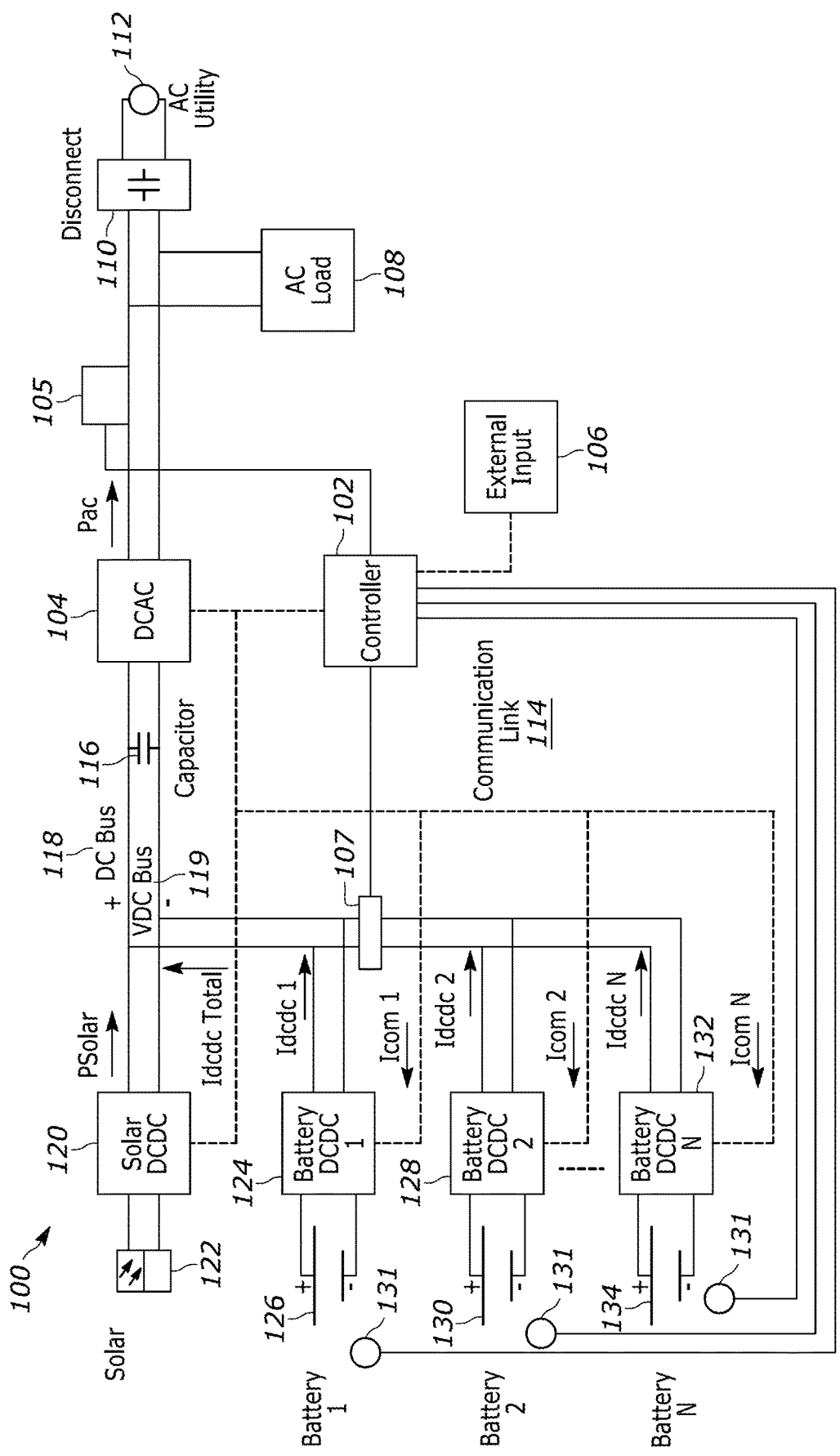
FIG. 1 comprises a block diagram of an energy storage system according to various embodiments of the present invention.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present teachings. Also, common but well-understood elements that are useful or necessary in a commercially feasible embodiment are often not depicted in order to facilitate a less obstructed view of these various embodiments of the present teachings. Certain actions and/or steps may be described or depicted in a particular order of occurrence while those skilled in the art will understand that such specificity with respect to sequence is not actually required.

DETAILED DESCRIPTION

The approaches provided herein control the operation of various electrical elements in energy storage systems, which may store energy in batteries or obtain energy from other sources. In the systems provided herein, DC power is converted to AC power and provided to AC loads and/or AC electrical utility grids. More specifically, these approaches control the amount of current and/or voltage provided by DC-DC converters to a DC bus to maintain a desired power level at an output of an AC-DC inverter that is coupled to the DC bus. In aspects, at least some of these operations are automatically performed during system operation and automatically react or adapt to the addition or removal of AC loads and/or connection to the AC utility grid.

Advantageously, these approaches do not limit the DC bus voltage range for DC buses as did previous approaches. For example, some previous approaches required higher voltage switching devices that were expensive and resulted in higher switching device losses. The present approaches do not require the use of these expensive devices.

The approaches provided herein also eliminate large AC currents being produced in the batteries as occurred with previous approaches. The AC power delivered by the DC-AC inverter is typically supported by a DC bus capacitor with a finite value and there will be some AC voltage present. Some previous approaches caused the DC-DC converters to respond to these AC voltages, resulting in large currents in the batteries. This caused large AC currents in the batteries that resulted additional losses and/or may be detrimental to the batteries and associated DC-DC converters. The approaches provided herein eliminate these drawbacks.

Additionally, the approaches provided herein reduce or eliminate delays resulting in incorrect DC-DC power to changes in the AC loads at the AC port of the DC-AC inverter. A fast change in the AC load must first change the voltage on the DC bus by the inverter drawing current from the DC bus capacitor. In some previous approaches, the DC-DC converter only responded after the DC bus voltage has changed and this resulted in a delayed power output from the DC-DC converter. If the fast change (or transient) is large enough, this delay may result in the DC bus voltage falling below the minimum level required for the DC-AC inverter to output AC power. The present approaches eliminate these types of problems.

In many of these embodiments, a DC-DC converter with two ports is capable of bidirectional power flow. A battery is coupled to the first port of the DC-DC converter. An inverter includes a DC port and an AC port where the DC port is coupled to the second port of the DC-DC converter and the AC port is coupled to the AC utility grid or an AC load or loads. A controller senses the power flow to or from the AC port, and determines a current command based on the sensed power flow. The current command is utilized by the DC-DC converter to control output current at the second port of the DC-DC converter.

In other examples, a plurality of DC-DC converters is configured so as to have their first ports connected to a plurality of batteries and their second ports connected to the DC port of an inverter. A controller receives a measure of AC power present at the AC port of the inverter and computes current commands that are utilized by the DC-DC converters to control the output currents at the respective second ports of the DC-DC converters where the sum of the current commands equal the total current desired and the individual current command values are a function of battery state of charge, battery relative capacity, and/or battery temperature.

In aspects, the inverter has a neutral point clamp topology. In other aspects, the controller is implemented in a Field Programmable Gate Array (FPGA).

In still other examples, the current commands are transmitted over a serial link that comports or conforms with the controller area network (CAN), RS485, Ethernet, FPGA with serializer/deserializer, fiber-optic, or some other serial protocol. In yet other aspects, all current commands are sent to all DC-DC converters.

In others of these embodiments, a system for powering an alternating current (AC) load from direct current (DC) power includes one or more DC-DC power converters each having a first port connected to a battery or energy source, each of the converters also having a second port; a DC-AC power inverter having a DC port electrically connected to the second port of each of the DC-DC power converters and an AC port configured to provide AC power to one or more of an AC load or AC utility grid; a sensor configured to detect a power flow variable at the AC port of the DC-AC power inverter; and a controller.

The controller is in communication with the sensor and each of the DC-DC power converters. The controller is configured to determine a current output for each of the DC-DC power converters based at least in part on the power flow variable of the sensor and send a command to the one or more of the DC-DC power converters causing the one or more DC-DC converters to output a DC current conforming to the determined current output, the DC current being sent from the second port to the DC port of the DC-AC power inverter.

In aspects, the controller is configured to determine the current output of each of the DC-DC power converters based further on one or more of a power available from a DC power source, a state-of-charge of the battery, a storage capacity of the battery, state of health of the battery, and a temperature of the battery. Other examples are possible.

In other examples, the energy source comprises a solar power source or a wind energy source. Other examples of sources are possible.

In yet other aspects, the controller determines the current output for the DC-DC power converter by determining a current output for each DC-DC power converter of the plurality of DC-DC power converters.

In some other aspects, the controller communicates a control command to each of the DC-DC power converters to output the current output.

In yet other examples, at least some of the DC-DC converters have a single phase non-isolated configuration. In other examples, the DC-AC inverter has a neutral point clamp configuration. Other configurations are possible.

In other examples, the controller communicates with each of the DC-DC power converters via a separate serial link. In aspects, the serial link protocol includes one or more of the CAN, RS485, FPGA with serializer/deserializer, fiber-optic, and Ethernet protocols. Other examples are possible.

In still others of these embodiments, an approach for controlling an energy storage system is provided. The system includes a DC-AC power inverter and at least one DC-DC power converter, the at least one DC-DC power converter configured to provide power to the DC-AC power converter and the DC-AC power converter having an AC port to provide power to an AC load.

The approach comprises detecting power flow from the AC port of the DC-AC power inverter; determining a current output for the at least one DC-DC power converter based at least in part on the power flow from the AC port; and causing the at least one DC-DC power converter to output the determined current output.

In aspects, the at least one DC-DC power converter includes a plurality of DC-DC power converters and causes the at least one DC-DC power converter to output the determined current output causing each one of the plurality of DC-DC power converters to output current to collectively achieve the determined current output.

In other aspects, the approach further comprises apportioning the determined current output to each of the DC-DC power converters based at least in part on one or more of a state-of-charge, a storage capacity, a state of health, and a temperature of the battery associated with each DC-DC power converter. Other examples are possible. In some examples, the apportioning is performed dynamically.

Referring now to FIG. 1, one example of a controlled and managed system 100 for energy storage is described. The system 100 includes a controller 102, a DC-AC inverter 104, external inputs 106, an AC load 108, a disconnect 110, an AC utility (or AC grid) 112, a communication link 114, a capacitor 116, a DC bus 118, a DC-DC solar converter 120, solar panels 122, a first DC-DC converter 124, a first battery 126, a second DC-DC converter 128, a second battery 130, a third DC-DC converter 132, and a first battery 134. The first DC-DC converter 124, second DC-DC converter 128, and third DC-DC converter 132 are also referred to as battery DC-DC converters herein. It will be appreciated that the number of converters, batteries, solar panels, and other energy sources shown in the system 100 may vary. For example, any number of batteries may be deployed. Additional energy sources such as windmill energy sources may also be included. The DC-DC converters may sense battery voltage and the information to the controller over the communication link 114 or other communication links (not shown in FIG. 1).

The controller 102 is any programmable electronic processing device such as a microprocessor, microcontroller, or Field Programmable Gate Array (FPGA) to mention a few examples. The controller 102 may itself include a memory that includes instructions or software code that are executed. These instructions may be used to perform the functions described herein such as determining the current required for the DC-DC converters 120, 124, 128, and 132. The controller 102 may be a separate unit or may be physically integrated (contained within) the DC-AC inverter 104, or in the DC-DC converter.

In aspects, the controller 102 determines the current required from the battery DC-DC converters 120, 124, 128, and 132. The controller 102 monitors power flow/current on AC side of DC/AC inverter with a sensor 105 (which can be any type of appropriate power sensor as known to those skilled in the art), calculates current needed from voltage bus and sends a current command to the DC-DC converters 120, 124, 128, and/or 132 to supply the needed current. A voltage sensor 107 monitors voltage on the bus 118 and this may be used in the calculations as described herein.

The DC-AC inverter 104 may be a single-phase, split-phase, or three-phase inverter as known to those skilled in the art and convert DC power into AC power. In other aspects, the DC-AC inverter 104 may be a split-phase inverter with a neutral point clamp configuration (NPC2). In still other examples, the DC-AC inverter 104 may have a neutral point clamp with NPC1 configuration. The DC-AC may also have a three-phase output with neutral point clamp configuration. In other examples, there may be a plurality of inverters operating in parallel fashion.

The external inputs 106 may be received from a user (e.g., via a GUI) and may be a selection of the desired power output of the DC-AC inverter 104 (Pac) or other parameters or values. The AC load 108 may be one or more machines or devices that utilize AC power. For example, electrical machinery in a factory or electrical devices in a home may utilize AC power.

The AC utility 112 may be an AC utility grid (e.g., a commercial AC utility grid) that supplies AC electrical power to customers. The disconnect 110 may be comprised of various electrical devices (e.g., switches) that selectively connect and disconnect the AC utility grid from the system 100. The control of the disconnect 110 may be manual or automatic (e.g., by the controller 102, the control line connection not being shown in FIG. 1).

The communication link 114 may be one of many serial or parallel links or lines conforming to communication protocols including but not limited to CAN, RS232, RS485, USB, Ethernet, SRIO, SPI, or I2C to mention a few examples. All communicated signals, including but not limited to Icom1, Icom2 to IcomN may be sent to all DC-DC converters in order to decrease protocol overhead, thereby increasing bandwidth and increasing link transmission rate and decreasing latency. This may be referred to as "broadcast" data. The communication link may have sufficient bandwidth, transmission rate and low latency to enable the battery DC-DC converters 124, 128, and 132 to output current to adequately maintain desired DC Bus voltage in response to fast AC load changes that may result from motor start, solar power fluctuation, grid failure, or other change in AC power (Pac). The sufficient transmission rate may be 1 kHz or greater with a latency less than 1 ms.

The capacitor 116 is a capacitor (or combination of capacitors) of appropriate values as known to those skilled in the art. The AC power delivered by the DC-AC inverter 104 is supported by the capacitor 116.

The DC bus 118 transmits DC voltages, currents and power from the DC-DC converters 120, 124, 128, and 130 to the DC-AC inverter 104. The DC bus 118 may have a positive polarity or may have a negative (or ground) polarity or orientation.

The solar panels 122 are any type of solar energy collection device that converts solar energy into electrical energy. The solar panels 122 supply voltage, power, and current to the DC-DC solar converter 120. It will be appreciated that the solar panels 122 may be omitted in some configurations and the number of batteries 126, 130, and 134 may vary from one to N, where N is an integer. The exact number of devices will vary based upon the needs of a particular customer or system. The solar DC-DC converter may use a mean power point tracking (MPPT) algorithm to determine its output power (Psolar).

The first DC-DC converter 124, second DC-DC converter 128, and third DC-DC converter 132 regulate the power supplied by the batteries 126, 130, and 134.

The first battery 126, second battery 130, and third battery 134 are energy storage devices the store DC electrical energy. In aspects, they receive energy from the solar panels 122, but could also receive energy from other external sources as well.

In aspects, the solar DC-DC converter 120 is a voltage source and the others DC-DC converters 124, 128 and 132 are current sources. The DC-DC converters 124, 128, and 132 output current as needed to the voltage bus 118 to provide enough power to the DC-AC inverter current at the DC voltage set by the voltage source (the DC-DC solar converter) to meet the AC side power needs (e.g., current needs at the AC voltage).

In one example of the operation of the system of FIG. 1, Pac (power to the grid) is sensed by the sensor 105, then the controller 102 calculates and commands current flow and/or voltages that each of the DC/DC converters 120, 124, 128, and 132 supplies. The DC-AC inverter 104 wants to output power to AC utility 112 (and/or AC load 108), pulls power from bus 118, which may cause a reduction in voltage, thereby causing the battery DC-DC converters 124, 128, and/or 132 to output more current.

In the case of the DC-AC inverter 104 being connected to the AC Utility 112 (i.e., the disconnect 110 has not disconnected the utility 112 from the system 100), the current required from the battery DC-DC converters 124, 128, and 132 may be a function of a variety of factors. These factors may include solar power (Psolar), Battery State of Charge (SOC), and/or an input from an external source 106.

The controller 102 may collect these quantities and compute a current command (Icom1) that is communicated to solar DC-DC converter 120 through the communication link 114. The DC-AC inverter 104 may control the voltage of the DC bus 118, by controlling the current at its DC port through controlling power to the AC Utility (Pac). If there are multiple batteries 126, 130, and 134 and battery DC-DC converters 124, 128, and 132, the controller 102 may compute individual current command signals (Icom1, Icom2, to IcomN) that are communicated to the battery DC-DCs 124, 128, and 132 where the sum of the individual signals is the total current required from the Battery DC-DCs (Icomtotal). Each battery DC-DC converter 124, 128, and 132 outputs current (IDC-DC) equal to its current command signal (Icom) such that the total sum of currents from the battery DC-DC converters' outputs to the DC Bus (IDC-DCtotal) is equal to the command signal quantity Icomtotal. The Icom commands may be signals that directly represent a current value (or a scaled current value).

It will be appreciated that controlling current output or power output of the battery DC-DC converter is essentially the same because the DC-DC converter can measure the Vbus voltage and compute power from the current (Poutput=Vbus*IDC-DC).

As mentioned, commands may be broadcast to all DC-DC converters. Alternatively, individual communication links may be provided from the controller 102 to each of the DC-DC converters.

In other aspects, the controller 102 may apportion the total current desired to each battery DC-DC converter 124, 128, and 132 based on the individual battery state of charge (SOC). In this respect, a state of charge sensor 131 may be coupled at each of the batteries 126, 130, and 134 and be communicatively coupled to the controller 102. Individual battery storage capacity relative to the other batteries, individual battery state of health, individual battery temperature, or other factors may also be sensed (with appropriate sensors) and communicated to the controller 102 and subsequently used in apportionment.

In aspects:

$$Icomtotal = \Sigma_{i=1}^{N} Icom_i$$

and $$Icom_i = \frac{Icomtotal}{N} \cdot k_i$$

and $$\Sigma_{i=1}^{N} k_i = 1$$

and $N$=Total number of Battery/DC-DC pairs and $ki$=constant to apportion current to DC-DCi In another aspect, the solar DC-DC converter 120, a battery DC-DC converter, or one of the multiple battery DC-DCs may control the voltage of the DC bus 118. The controller 102 may compute Icomtotal or Icomi based on the AC power (Pac), solar power (Psolar) and Vbus per the following:

$$Icomtotal = \frac{Pac - Psolar}{Vbus}$$

The disconnect 110 may be closed in the case of the DC-AC inverter 104 being in grid-connected mode where it may control power to the grid, or the disconnect 110 may be open and the DC-AC inverter 104 is in grid-forming mode and supplies the AC load or loads 108 with power.

In some examples, Icomtotal is a number set and it can be set at system start-up. Dynamically, the controller 102 may change the values of individual current command signals (Icom1, Icom2, to IcomN). Pac may be a desired value set at system set-up.

Figure 2:
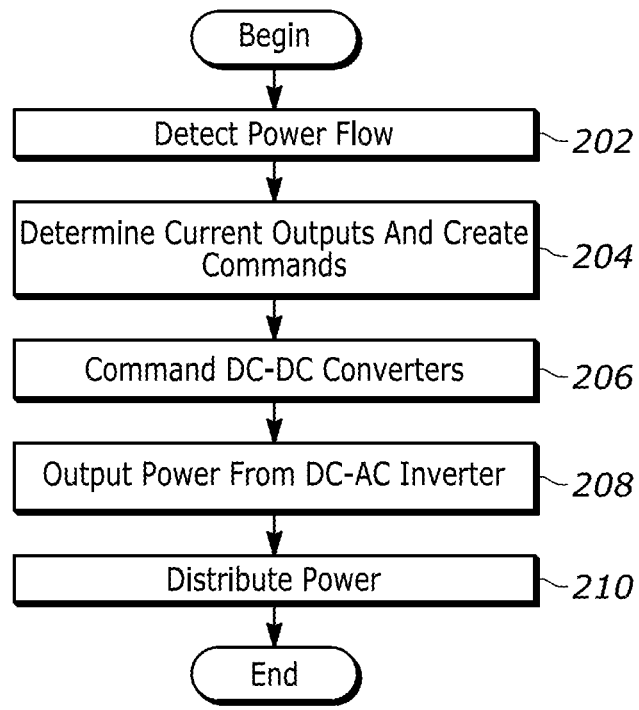
FIG. 2 comprises a flowchart of one approach for operating and controlling elements within an energy storage system according to various embodiments of the present invention.

Referring now to FIG. 2, one example of an approach for operating a power storage system (e.g., the system 100 of FIG. 1) is described. The system includes a DC-AC power inverter (e.g., DC-AC inverter 104) and at least one DC-DC power converter (e.g., DC-DC power converters 120, 124, 128 and/or 132). The at least one DC-DC power converter is configured to provide power to the DC-AC power converter and the DC-AC power converter has an AC port to provide power to an AC load.

At step 202, power flow is detected from the AC port of the DC-AC power inverter. For example, a sensor (e.g., sensor 105) at the AC port may be configured to sense the power flow. The power flow may be an amount (value) and a direction (e.g., a positive power flow may indicate power moving out of the DC-AC inverter (e.g., the DC-AC inverter 104) and a negative power flow may indicate power moving into the DC-AC converter).

At step 204, a determination is made for current output for the at least one DC-DC power converter based at least in part on the power flow from the AC port. Examples of this approach are discussed elsewhere herein.

At step 206, at least one DC-DC power converter is commanded to output the determined current output. For example, the Icom commands discussed elsewhere herein may be utilized. The Icom commands may be an electrical signal representing an absolute current level or a scaled current value.

At step 208, after the current adjustment has been made at step 206, the DC-AC power converter outputs the desired AC power Pac.

At step 210, this AC power is distributed to an AC utility (e.g., AC utility 112) or one or more AC loads (AC load 108).

Figure 3:
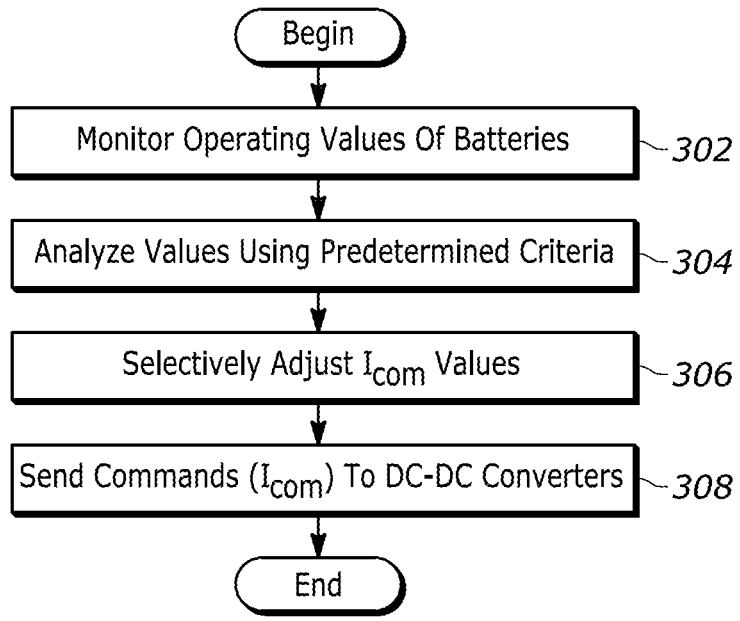
FIG. 3 comprises a flowchart of one approach for determining current command Icom values for individual DC-DC converters according to various embodiments of the present invention.

Referring to FIG. 3, one example of an approach for dynamically changing the individual current command signals (Icom1, Icom2, to IcomN) is described. As described previously herein, Pac represents the desired AC power that is monitored at the output of the DC-AC inverter (and may represent an amount desired by and input into the system by the user). Vbus represents the voltage as measured on the bus that couples the DC-AC inverter to one or more DC-DC converters and is measured (e.g., by the sensor 107). Vbus may effectively be a constant voltage. Icomtotal is defined to be:

$$Icomtotal = \frac{Pac - Psolar}{Vbus}$$

Dynamically, the controller may change the values of individual current command signals (Icom1, Icom2, to IcomN) dynamically during system operation. For example, a check can be made of battery conditions at predetermined time intervals (e.g., once an hour or every minute). Alternatively, potential changes may be made upon the occurrence of an event (e.g., Pac falling below a threshold).

At step 302, a controller (e.g., the controller 102) monitors operating values of the batteries. For example, the state of charge of each battery may be sensed by a sensor (e.g., the sensors 131) and the measured value sent to the controller.

At step 304, the values are analyzed. For example, some batteries may have a low charge value and others a higher charge value. The exact values or thresholds as to high or low charges may be programmed by the user into the controller, for example, when the system is set up. Other analysis criteria may also be used.

At step 306, the Icom values (supplied to the battery DC-DC converters) are selectively adjusted. For example, batteries with a low state of charge may be selected to have their associated DC-DC converter have a lower Icom value. Batteries with a comparative higher state of charge may be selected to have their associated DC-DC converter have a comparatively higher Icom value. In some aspects and under some criteria or circumstances, no changes to the current Icom values are made. In yet other examples, a determination is made that the Icom values should be the same (e.g., the operating parameters of the batteries are the same or substantially the same) for each DC-DC converter.

At step 308, commands (Icom commands) are sent to the converters. As mentioned, these may be broadcast or sent individually to each of the DC-DC battery controllers. And, as mentioned, the process may occur dynamically, for example, every minute, every hour, every day.

Figure 4:
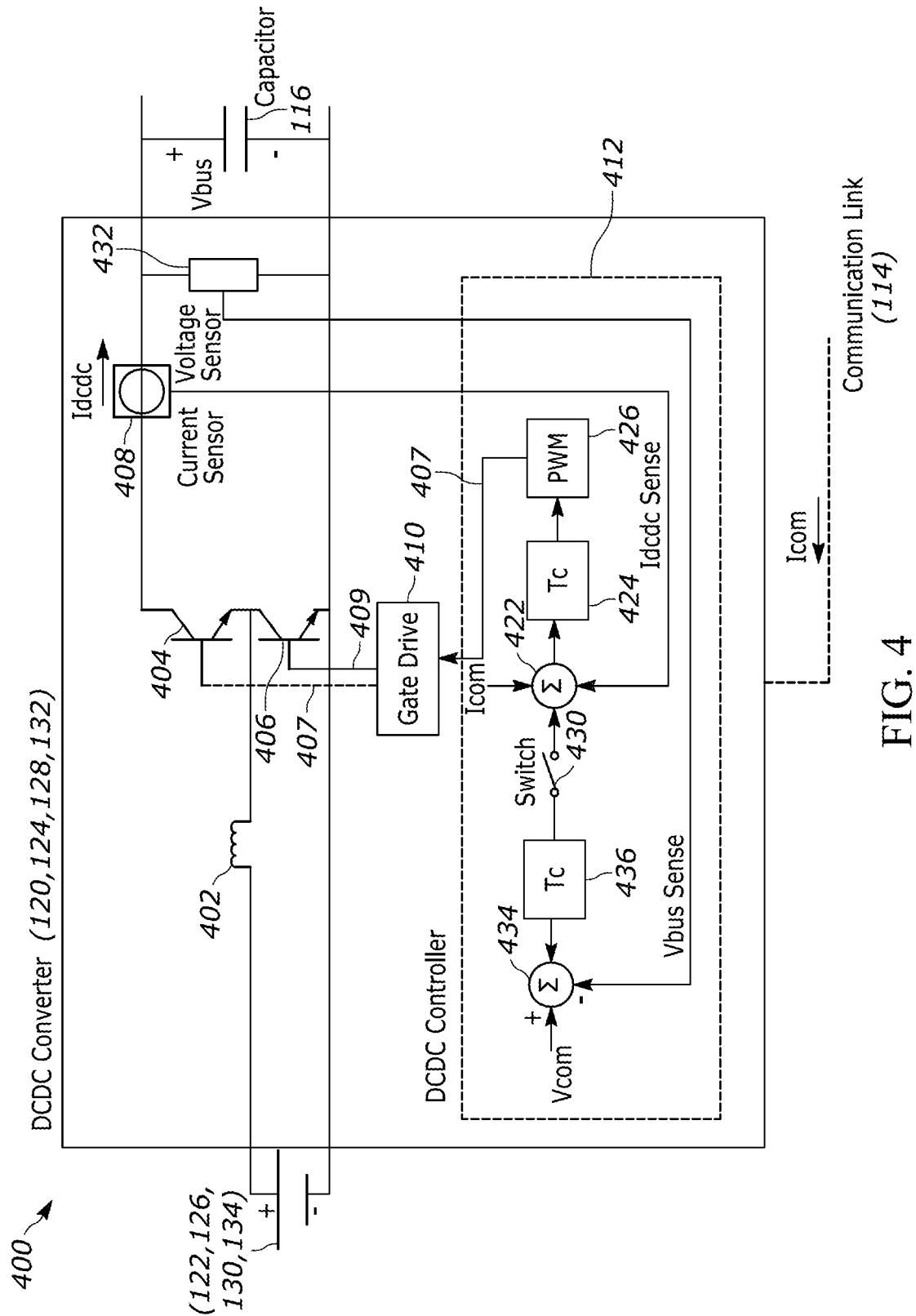
FIG. 4 comprises a circuit diagram of a DC-DC converter according to various embodiments of the present invention.

Referring to FIG. 4, one example of a DC-DC converter 400 (e.g., one of the DC-DC converters 120, 124, 128, and/or 132 shown in FIG. 1) is described. The DC-DC converter 400 includes an inductor 402, a first transistor 404 (e.g., any appropriate transistor such as a FET), a second transistor 406 (e.g., any appropriate transistor such as a FET), a current sensor 408, a gate driver 410, and a DC-DC controller 412. The DC-DC controller 412 includes a summer 422, a transfer controller (TC) 424, and a pulse width modulator 426.

In the example of FIG. 4, the DC-DC controller 412 is used as a battery DC-DC controller 128 that operates to control DC-DC voltage output with a switch 430 closed or to control DC-DC current output with switch 430 open. In the case of voltage control, the current command input may operate as a current offset and may be used to set current output with the voltage control loop providing additional command to the current control loop. This may be referred to as a "feed-forward" input. In this case, a Vcom command is received from the controller 102. Sensed voltage is received from a voltage sensor 432 and an error determined by summer 434 and amplified. It will be appreciated that the voltage control elements (430, 432, 434, and 436) may be removed completely or switch 430 opened to effectively remove the remaining elements.

In one example of the operation of FIG. 4, an Icom command is received from the system controller (e.g., controller 102). This command may specify the amount of current to be produced by the DC-DC converter 400. In examples, the command is or represents an absolute current value. In other examples, the command is or represents a scaled value. Other command structures are possible including digital commands that are messages recognizable by the DC-DC converters. In the case of digital representations, additional circuitry may be needed in the example of FIG. 4 to recognize or interpret these representations.

This command is applied to the summer 422, which takes the difference between Icom value and the sensed output current value to produce an error signal. The error signal is amplified by the TC 424. The PWM 426 produces a signal 407, which in aspects is a series of pulses representing the error signal. The gate drive 410 produces an inverted version 409 of this signal. Signal 407 is applied to the transistor 404 and the signal 409 is applied to the transistor 406. In this way, the transistors 404 and 406 are alternatively turned on and off depending upon the output of the PWM 426. With transistor 404 on and transistor 406 off, current flows from the inductor 402 through sensor 408 and out of the device 400. With transistor 404 off and transistor 406 on, current does not flow from the inductor 402 through sensor 408.

The DC-DC converter topology depicted in FIG. 4 is a single phase non-isolated DC-DC converter. It will be understood that the DC-DC may be a multi-phase converter, and/or an isolated converter with flyback, resonant, or forward converter topology. Other examples are possible.

Uses of singular terms such as "a," "an," are intended to cover both the singular and the plural, unless otherwise indicated herein or clearly contradicted by context. The terms "comprising," "having," "including," and "containing" are to be construed as open-ended terms. It is intended that the phrase "at least one of" as used herein be interpreted in the disjunctive sense. For example, the phrase "at least one of A and B" is intended to encompass A, B, or both A and B.

While there have been illustrated and described particular embodiments of the present invention, those skilled in the art will recognize that a wide variety of modifications, alterations, and combinations can be made with respect to the above-described embodiments without departing from the scope of the invention, and that such modifications, alterations, and combinations are to be viewed as being within the ambit of the inventive concept.

What is claimed is:

1. A system for powering an alternating current (AC) load from direct current (DC) power, the power converter comprising:
    one or more DC-DC power converters each having a first port connected to a battery or energy source, each of the converters also having a second port;
    a DC-AC power inverter having a DC port electrically connected to the second port of each of the DC-DC power converters and an AC port configured to provide AC power to one or more of an AC load or AC utility grid;
    a sensor configured to detect a power flow variable at the AC port of the DC-AC power inverter; and
    a controller in communication with the sensor and each of the DC-DC power converters, the controller configured to:
        determine a current output for each of the DC-DC power converters based at least in part on the power flow variable of the sensor; and
        send a command to the one or more of the DC-DC power converters causing the one or more DC-DC converters to output a DC current conforming to the determined current output, the DC current being sent from the second port to the DC port of the DC-AC power inverter.

2. The system of claim 1 wherein the controller is configured to determine the current output of each of the DC-DC power converters based further on one or more of a power available from a DC power source, a state-of-charge of the battery, a storage capacity of the battery, state of health of the battery, and a temperature of the battery.

3. The system of claim 1, wherein the current output is determined dynamically.

4. The system of claim 1, wherein the energy source comprises a solar power source.

5. The system of claim 1, wherein the controller communicates a control command to each of the DC-DC power converters to output the current output.

6. The system of claim 1, wherein at least some of the DC-DC converters have a single phase non-isolated configuration.

7. The system of claim 1, wherein the DC-AC inverter has a neutral point clamp configuration.

8. The system of claim 1, wherein the controller communicates with each of the DC-DC power converters via a separate serial link.

9. The system of claim 8, wherein the serial link protocol includes one or more of CAN, RS485, and Ethernet.

10. A method of controlling an energy storage system, the system including a DC-AC power inverter and at least one DC-DC power converter, the at least one DC-DC power converter configured to provide power to the DC-AC power converter and the DC-AC power converter having an AC port to provide power to an AC load, the method comprising:
    detecting power flow from the AC port of the DC-AC power inverter;
    determining a current output for the at least one DC-DC power converter based at least in part on the power flow from the AC port; and
    causing the at least one DC-DC power converter to output the determined current output.

11. The method of claim 10 wherein the at least one DC-DC power converter includes a plurality of DC-DC power converters, and
    wherein causing the at least one DC-DC power converter to output the determined current output includes causing each one of the plurality of DC-DC power converters to output current to collectively achieve the determined current output.

12. The method of claim 11, wherein determining the current output comprises apportioning the determined current output to each of the DC-DC power converters based at least in part on one or more of a state-of-charge, a storage capacity, a state of health, and a temperature of the battery associated with each DC-DC power converter.

13. The method of claim 12, wherein the apportioning is performed dynamically.

14. The method of claim 10, wherein a controller performs the steps and communicates with each of the DC-DC power converters via a separate serial link.

* * * * *